(12) United States Patent
Jones et al.

(10) Patent No.: US 6,611,142 B1
(45) Date of Patent: Aug. 26, 2003

(54) APPARATUS AND METHOD OF MEASURING THE MULTI-DIMENSIONAL MAGNETIC FIELD DISTRIBUTION OF A MAGNETIC SAMPLE IN REAL-TIME

(75) Inventors: David Geraint Rhys Jones, Bristol (GB); Pascual Ian Nicholson, Bristol (GB); Paul Gerald Cox, Bristol (GB)

(73) Assignee: Redcliffe Limited, London (GB)

( * ) Notice: Subject to any disclaimer, the term of this patent is extended or adjusted under 35 U.S.C. 154(b) by 0 days.

(21) Appl. No.: 09/402,106

(22) PCT Filed: Apr. 1, 1998

(86) PCT No.: PCT/GB98/00970
§ 371 (c)(1),
(2), (4) Date: Jan. 28, 2000

(87) PCT Pub. No.: WO98/44360
PCT Pub. Date: Oct. 8, 1998

(30) Foreign Application Priority Data

Apr. 1, 1997 (GB) .............................................. 9706516
Sep. 5, 1997 (GB) .............................................. 9718897

(51) Int. Cl.$^7$ ........................ G01R 33/10; G01R 33/07
(52) U.S. Cl. ...................... 324/261; 324/205; 324/219; 324/226; 324/247; 324/251; 324/261; 324/262
(58) Field of Search ................................ 324/205, 211, 324/219, 220, 226, 227, 235, 244, 247, 248, 251, 252, 261, 262, 263

(56) References Cited

U.S. PATENT DOCUMENTS

| | | | | |
|---|---|---|---|---|
| 3,617,874 A | * | 11/1971 | Forster ................... | 324/263 X |
| 3,939,404 A | * | 2/1976 | Tait ......................... | 324/226 X |
| 4,434,659 A | * | 3/1984 | Kurtz et al. ............. | 324/262 X |
| 4,465,975 A | * | 8/1984 | Porter ..................... | 324/261 X |
| 4,864,239 A | * | 9/1989 | Casarcia et al. ............. | 324/262 |
| 5,126,669 A | * | 6/1992 | Honess et al. .............. | 324/261 |
| 5,155,433 A | * | 10/1992 | Allen, III et al. ........ | 324/262 X |
| 5,339,031 A | * | 8/1994 | Chern ........................ | 324/219 |
| 5,394,083 A | | 2/1995 | Jiles ........................... | 324/223 |
| 5,644,230 A | * | 7/1997 | Pant et al. ................... | 324/247 |
| 5,747,998 A | * | 5/1998 | Fowler et al. ............... | 324/263 |
| 5,786,690 A | * | 7/1998 | Kirtley et al. ........... | 324/247 X |
| 5,894,220 A | * | 4/1999 | Wellstood et al. ...... | 324/262 X |

FOREIGN PATENT DOCUMENTS

| | | | | |
|---|---|---|---|---|
| SU | | 824089 | * 4/1981 | ................. 324/205 |
| WO | WO 92/21039 | | 11/1992 | ........... G01R/33/10 |

OTHER PUBLICATIONS

Meydan, T., et al., "Computerised three–dimensional magnetic field measurements," 8405 Jnl. Magnetism and Magnetic Materials, 112 (1992)I Jul., Nos. 1/3, Amsterdam, NL, pp. 64–66.

* cited by examiner

Primary Examiner—Gerard R. Strecker
(74) Attorney, Agent, or Firm—Connolly Bove Lodge & Hutz LLP; Larry J. Hume

(57) ABSTRACT

An apparatus for measuring the magnetic field distribution of a magnetic sample includes a magnetic field sensor arrangement having three, orthogonally-disposed, Hall sensors for sensing the magnetic field produced by a magnetic sample at a given location, The sensor arrangement is scanned along a predetermined scan pattern. The apparatus then acquires sampling data from the sensor arrangement, the sampled data providing a representation of the magnetic field distribution of the magnetic sample. The data is preferably acquired by an interface card for a PC, which stores sampled data in the main memory of the PC for data analysis and display.

24 Claims, 10 Drawing Sheets

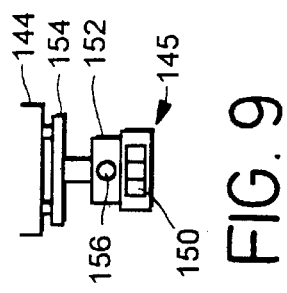
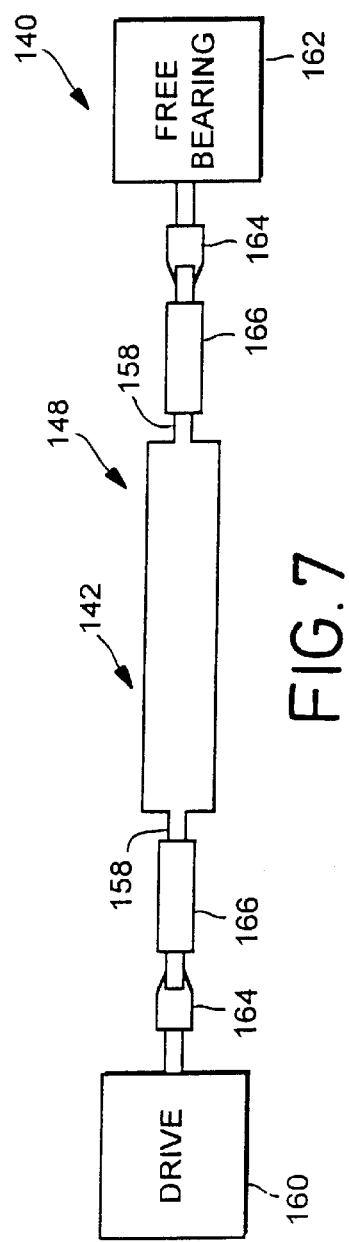
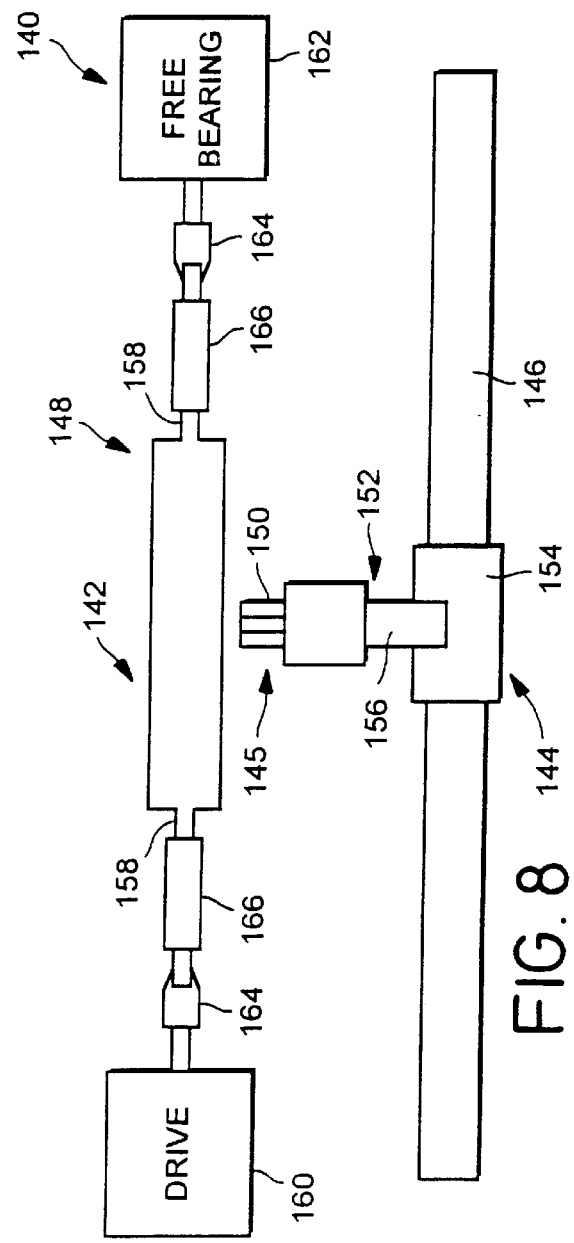

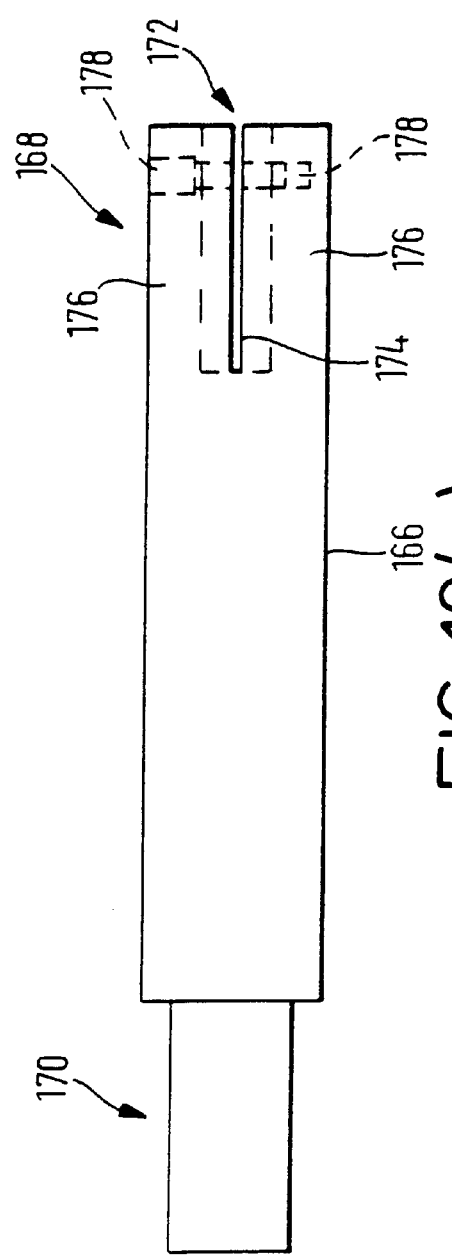

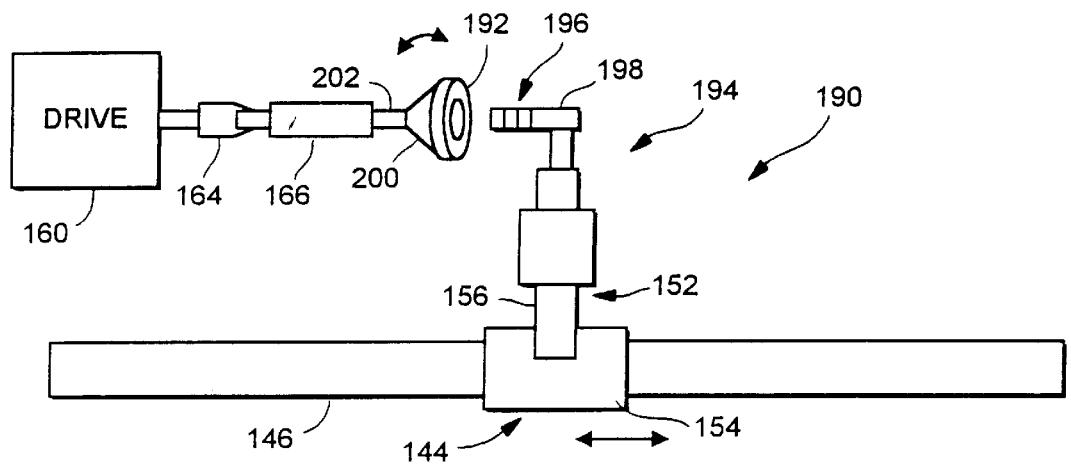
FIG. 12
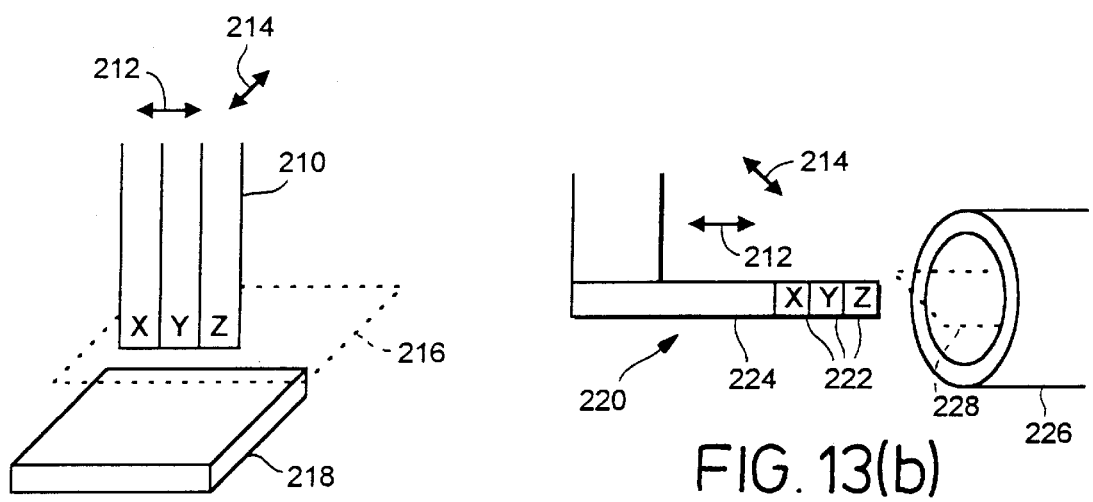
FIG. 13(a)
FIG. 13(b)

APPARATUS AND METHOD OF MEASURING THE MULTI-DIMENSIONAL MAGNETIC FIELD DISTRIBUTION OF A MAGNETIC SAMPLE IN REAL-TIME

FIELD OF THE INVENTION

The present invention relates to an apparatus and a method of measuring the magnetic field distribution of a magnetic sample. More particularly though not exclusively, the present invention relates to a magnetic field distribution measuring system employing a magnetic field scanner together with relatively fast data acquisition and data analysing to provide the user with detailed magnetic field maps in seconds.

BACKGROUND OF THE INVENTION

In trying to determine the magnetic field distribution in space due to systems containing magnetised ferromagnetic material and/or electromagnetic components, it is very difficult to achieve a precise analytical solution such as may be possible in an electrical counterpart for anything other than the simplest of geometries due to the relative permeability of iron being very much less than the electrical conductivity of copper relative to air.

One advance which has revolutionised the design of electromagnetic systems over the last 15 years is the computer modelling of magnetic fields, the methods most usually employed being finite element, or finite difference, analysis. From the electromagnetic characteristics of the components of a particular system, numerical methods are used to calculate the magnetic field at any given point, calculating the fields at enough points to a high enough resolution giving an effective field distribution. It is now possible to calculate quite complex transient field distributions from sophisticated designs in a matter of minutes on a modem desktop PC.

As with any computer model, however, these methods rely on accurate information regarding the behaviour of the individual components in varying magnetic fields, particularly ferromagnetic materials such as permanent magnets or soft magnetic iron alloys.

This requires very accurate materials characterisation to determine the relevant magnetic parameters, and also assumes consistent material properties across one or more supplied batches, which is often difficult to guarantee.

Permanent magnets, in particular, are very difficult to characterise completely due to the innate hysteretic nature of their behaviour.

Thus, despite the great advances in design made possible by electromagnetic computer modeling, there exists a great need for actual physical measurement of magnetic field distributions.

Conventional measurement systems lag far behind the representations and visualisations afforded by computer modelling, however, offering, at best, measurement of varying fields at a point, rather than the field distribution over an area.

Accordingly, it is an object of the present invention to provide a magnetic field distribution measurement system which overcomes at least some of the above problems.

SUMMARY OF THE INVENTION

According to one aspect of the present invention there is provided an apparatus for measuring a magnetic field distribution of a magnetic sample, the apparatus comprising magnetic field sensing means for sensing the magnetic field produced by the magnetic sample at a given location; scanning means arranged to move said sensing means along a predetermined scan pattern; and data acquisition means for sampling data from said sensing means, said sampled data providing a representation of the magnetic field distribution of the magnetic sample.

The data acquisition means is preferably arranged to carry out relatively fast data acquisition and to store the sampled data in a storage means in real time. In one embodiment of the invention, a typical scan pattern covering an area of 20 mm×20 mm at a resolution of 0.1 mm (i.e. 40,000 data points) takes less than 90 seconds to complete. In this embodiment, the magnetic field sensing means and the data acquisition means are arranged to sense the magnetic field in three orthogonal dimensions at each sampled location (data point) which helps to establish the magnitude and direction of the magnetic field at that location.

The relatively high speed of operation of the data acquisition means can be achieved by using a dedicated processor means and a storage means as part of the acquisition means. If the acquisition means is formed as a slot-in card for a Personal Computer (PC), then data can be sampled, stored in temporary memory on the card and transferred to the main storage means (memory) of the PC using direct memory access, for example.

The data acquisition means is preferably arranged to control movement of the scanning means. This advantageously ensures that the coordination between the sampling of the sensing means and its scanning movement can both be synchronised. In addition, the status of the scanning means is preferably checked by the data acquisition means to ensure that the apparatus is only operated under predetermined status conditions.

The apparatus preferably includes processing means for processing the sampled data into an image format and for displaying the data on display means, such as on a high resolution colour monitor as a coloured magnetic field map. The processing means may also include means for analysing the sampled data to determine magnetic force vectors or lines of force which can be superimposed on the displayed magnetic field map. In addition, magnetic field strength cross-sectional information can also preferably be provided by the analysing means. This display of magnetic field data allows easy comparison with computer modelled predictions of magnetic field, providing an invaluable check with the "real world" for computer modellers.

According to another aspect of the present invention there is provided a scanning apparatus for scanning a magnetic field of a magnetic sample, said apparatus comprising: a scanning head comprising at least one magnetic field sensor; first moving means for controllably moving the scanning head in a first coordinate dimension; and second moving means for controllably moving the scanning head in another coordinate dimension, said first and second moving means being controllable to effect scanning of said head over a plane surface above the magnetic sample.

According to another aspect of the present invention there is provided a magnetic field scanning head for use with a scanning apparatus, said head comprising a plurality of magnetic field sensors spaced apart along a scan line, each sensor sensing magnetic field strength in a different direction to the other sensors, and the head being arranged to be moved along said scan line during a scanning operation such that each sensor can sense the magnetic field in its direction at a given location.

According to another aspect of the present invention there is provided a method of measuring a magnetic field of a magnetic sample, the method comprising: sensing the magnetic field produced by the sample at a given location using sensing means; moving the sensing means to a new location; repeating the sensing and moving steps to effect a scan of the magnetic field distribution over a predetermined scan area; and sampling the magnetic field data produced by the sensing means, said sampled data providing a representation of the magnetic field distribution of the magnetic sample.

The present invention has application in a method of carrying out quality control checks on a production line of magnetic samples and in computer aided engineering of permanent magnets, magnetic components and/or magnetising fixtures.

The above and further features of the present invention are set forth with particularity in the appended claims and will become clearer from consideration of the following detailed description of exemplary embodiments of the present invention given with reference to the accompanying drawings.

BRIEF DESCRIPTION OF THE DRAWINGS

FIG. 7 is a schematic side view of a roller scanner embodying the present invention;

FIG. 8 is a schematic plan view of the roller scanner of FIG. 7;

FIG. 9 is a schematic side view of a scanning head mechanism shown in FIG. 8;

FIGS. 10(a) and 10(b) are schematic side and end views of the adaptor shown in FIGS. 7 and 8;

FIG. 12 is a schematic plan view of another roller scanner embodying the present invention;

FIG. 13(a) is a schematic perspective view of a flatbed scanner; and

FIG. 13(b) is an adaptation of the flatbed scanner head shown in FIG. 13(a) for use in scanning flat planes within magnetic cylinders or rings.

DETAILED DESCRIPTION OF PREFERRED EMBODIMENTS

Figure 1:
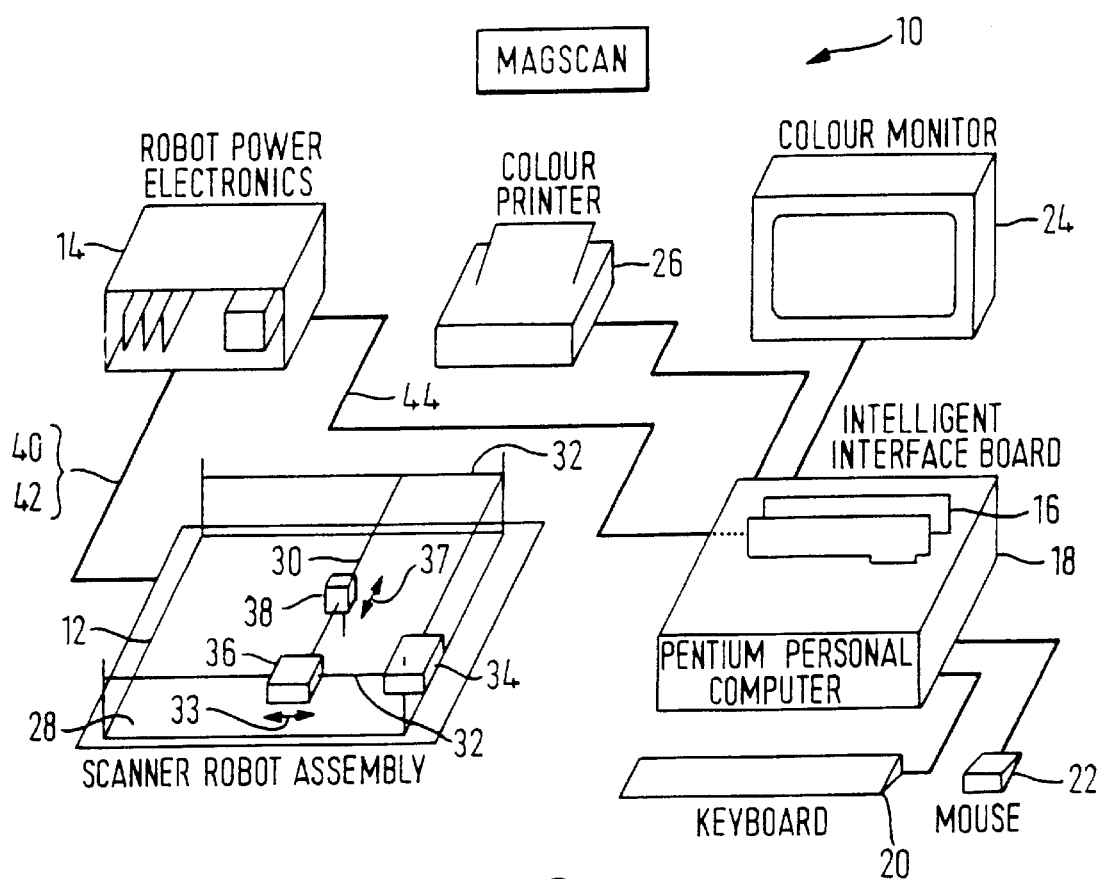
FIG. 1 is a schematic diagram showing a magnetic field measurement system embodying the present invention.
Figure 2:
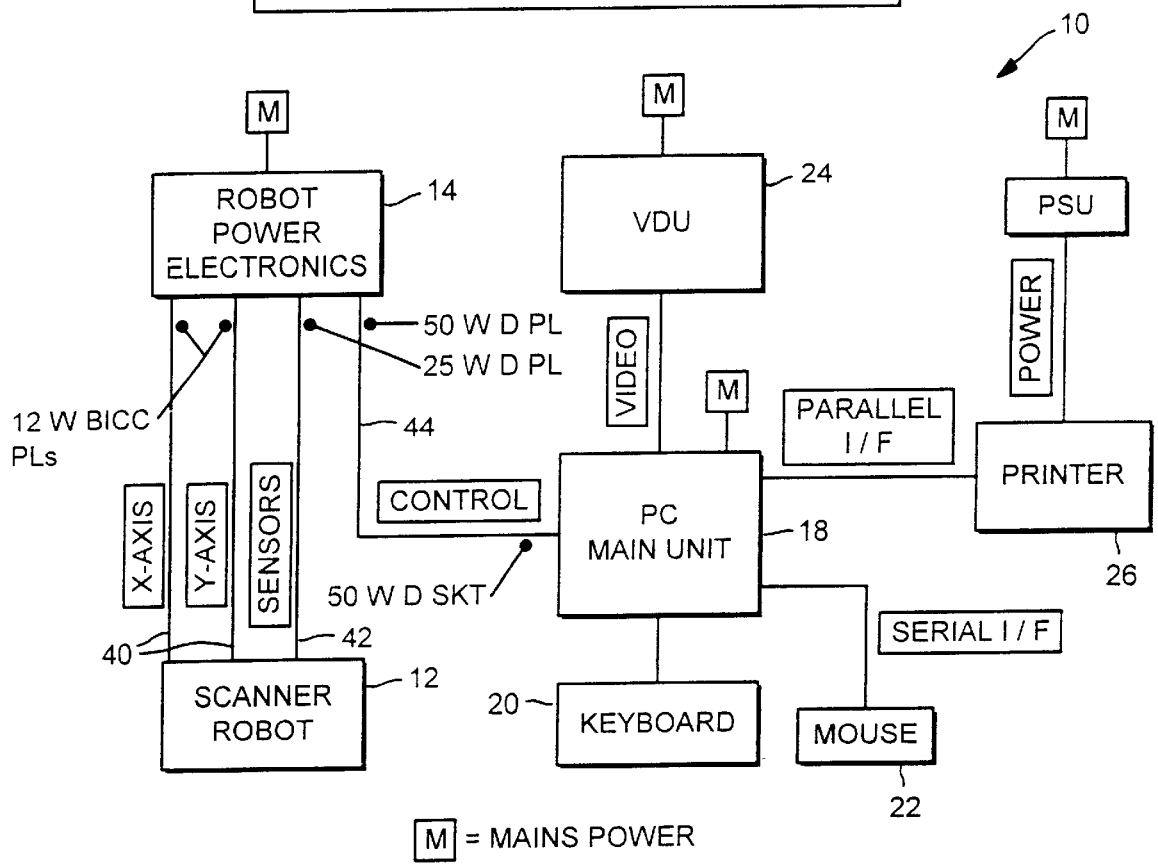
FIG. 2 is a schematic block diagram of the system of FIG. 1 showing the interconnections provided between the modules of the system.

Referring to FIGS. 1 and 2, there is shown a magnetic field measurement system 10 embodying the present invention. The system 10 includes a scanner robot assembly 12 which is used for obtaining raw magnetic field strength data over a user selected scanning area in which a magnetic sample (not shown) is placed. The assembly 12 is connected to a robot power electronics module 14 which controls the precise movements of the robot assembly 12 for effecting scanning. The module 14 is driven by an intelligent interface board 16 within a PC (Personal Computer) 18 and the board 16 also functions to control acquisition of the data from the assembly 12 via the module 14. The PC 18, which is preferably Pentium™ microprocessor based, is linked up to input/output peripherals such as a keyboard 20, a mouse 22, a colour monitor 24 and a colour printer 26. The monitor 24 and printer 26 are used to display the acquired data in a graphical user-friendly format. The keyboard 20 and mouse 22 are simply provided for allowing the user high level control of the system 10.

The scanner robot assembly 12 is similar in structure to an X-Y flatbed plotter device in that it has a flat surface 28 for supporting a magnetic sample (not shown) to be analysed and a longitudinal arm 30 which is laterally movable along two spaced apart lateral supporting members 32. At one end of a lateral supporting member 32, a lateral drive unit 34 is provided which is fixed to member 32. The lateral drive unit 34 operates on a longitudinal drive unit 36, which is fixed to one end of the longitudinal arm 30, to move the unit 36 along one of the members 32 in the dimension indicated by arrows 33. Movement of the longitudinal drive unit 36 is accurately determined by a stepper motor (not shown) within the lateral drive unit 34 which is coupled to the longitudinal unit 36 by means of a drive belt (not shown).

The longitudinal drive unit 36, provided at one end of the longitudinal arm 30, operates on a sensor head 38 which is slidably movable along the longitudinal arm 30 in the dimension indicated by arrows 37. Movement of the sensor head 38 is accurately determined by a stepper motor (not shown) within the longitudinal drive unit 36, which is linked to the sensor head 38 by means of another drive belt (not shown). The sensor head 38 comprises three Hall sensors (see FIG. 3) and is arranged to sense the magnetic field generated by a magnetic sample (not shown).

Each of the stepper motors is directly linked via leads 40 to the robot power electronics module 14 such that the precise degree of movement of each stepper motor, and hence of the longitudinal and lateral drive units 34, 36, is controlled by the module 14. In this embodiment, the minimum step size for scanning movement is 0.1 mm and the maximum step size 10 mm. The scanning area over which the stepper motors can move the sensor head 38 is between 4 mm$^2$ and 200 mm$^2$. However, it is possible without undue effort to vary these parameters if desired when designing another embodiment of the present invention.

The sensor head 38, which will be described in detail hereinafter with reference to FIG. 3, generates analogue field signals from each of its Hall sensors. These signals are passed via leads 42 to the robot power electronics module 14 and then via leads 44 onto the intelligent interface board 16 in the PC 18.

The robot power electronics module 14 contains two servo drive units (power electronics—not shown) required to convert the low power control signals received from the interface board 16 into relatively high-power 5 phase AC drive signals for each stepper motor. In addition, the module 14 includes a power supply (not shown) for each of the three Hall probes.

Figure 4:
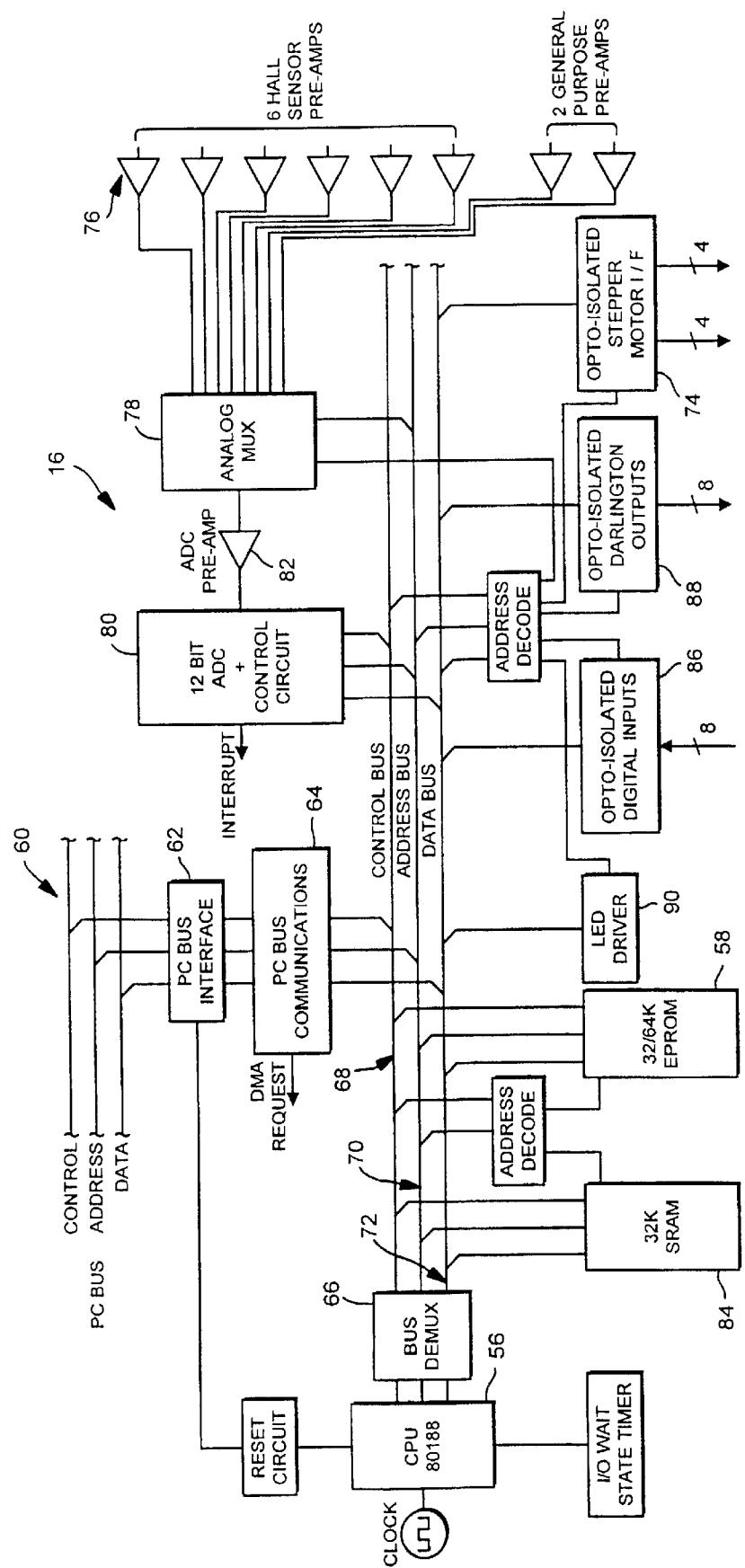
FIG. 4 is a schematic block diagram of the intelligent interface board of FIG. 1.

The intelligent interface board 16 is a standard size full length plug-in board for a standard PC. The function of the board 16, which is described hereinafter in detail with reference to FIG. 4, is essentially to control the scanning of the sensor head 38 by use of stepper motor control signals and to provide fast data acquisition of the data generated by each of the Hall probes. The high-speed data acquisition is made possible by the provision of a dedicated microprocessor on the board 16 which controls analogue to digital conversion, data storage, transfer of data to the PC memory using direct memory access and stepper motor control signal generation.

The PC 18 ultimately stores the digitised magnetic field data generated by the Hall sensors and acquired by the intelligent interface board 16. In addition, the PC serves to process the data into the user understandable form of magnetic field maps. Furthermore, use of a PC 18 allows the use of high-level software which is menu driven to provide an easy to understand user-interface.

Figure 3:
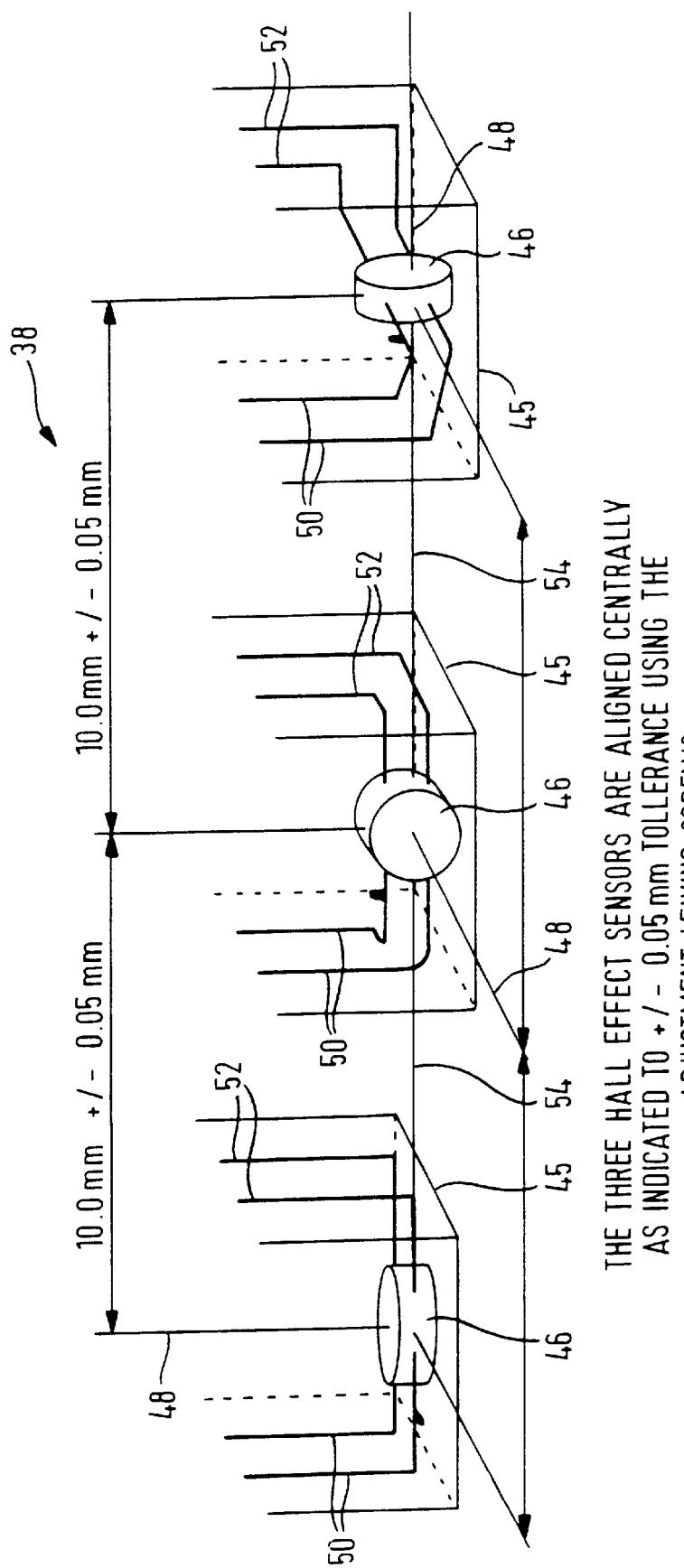
FIG. 3 is a schematic diagram showing the arrangement of Hall sensors in the scanning head of the scanner robot assembly of FIG. 1.

Referring now to FIG. 3, the sensor head 38 comprises three Hall probes 45 each having a Hall sensor 46 provided therein. Each sensor 46 is oriented in a different direction to the other sensors 46 such that the three sensors are oriented in orthogonal axes 48. Each sensor 46 is provided with its own set of power supply leads 50 and its own set of output signal leads 52 which make up the leads 42 to the robot power supply electronics module 14.

The spacing of the sensors 46 is important as at any given sample point in a magnetic field, a field strength measurement in each of the three orthogonal axes 48 is required. In this embodiment, the centres of the sensors 46 are spaced apart from each other by 10 mm with a tolerance of ±0.05 mm. In addition, the probes 45 and the sensors 46 are arranged in a linear array about a common scan movement axis 54. Therefore, when scanning along the scan movement axis 54, by arranging the step size appropriately, a given point in a magnetic field can be accurately revisited and sampled by each of the sensors 46 such that a 3-dimensional representation can be built up of the magnetic field at such a given point.

In order to have accurate positioning of each sensor 46 at a given sample point, there needs to be co-ordination between the step size of movement and the spacing between the sensors 46; the spacing needs to be an integer multiple of the step size. However, as the spacing is not variable and is determined by the design of the sensor head 38, restrictions on the choice of user-selected step size have to be imposed. In this embodiment, the user is permitted the following step sizes: 0.1 mm; 0.2 mm; 0.5 mm; 1.0 mm; 2.0 mm; 5.0 mm and 10.0 mm.

Referring now to FIG. 4, a schematic block circuit diagram of the intelligent interface board 16 is shown. As mentioned previously, the main functions of this board 16 are to control the scanning of the sensor head 38, to provide fast data acquisition from the Hall sensors 46 and data conversion into the digital domain, and finally to transfer the received data into the memory (not shown) of the PC 18. All of these functions are carried out under the control of a dedicated microprocessor 56.

The software for controlling the operation of the microprocessor 56 is hard programmed into an EPROM 58, which enables the interface card 16 to rapidly carry out tasks when triggered by simple high-level commands from a main program running in the memory of the PC 18. Communications between the microprocessor 56 and the PC 18 are carried out via connection of the interface board 16 to a PC bus 60. A PC bus interface module 62 is provided together with a PC bus communications module 64 which are connected to the microprocessor 56 via a bus multiplexer 66 and a control bus 68, an address bus 70 and a data bus 72. By means of this communications link the program running on the PC 18 can download information such as user selected step size and scanning area to the microprocessor 56. Using this data the microprocessor 56 can calculate the necessary stepper motor control signals for controlling the stepper motors of the longitudinal and lateral drive units 36, 34. These control signals are output to the robot power electronics module 14 via the opto-isolated stepper motor interface 74.

The interface board 16 is designed to sample the analogue signals which are continuously being output by the Hall sensors 46. These analogue signals are fed into the interface board 16 and are buffered and amplified by pre-amplifiers 76. The outputs of the pre-amplifiers 76 are coupled to an 8 to 1 channel analogue multiplexer 78 which cyclically selects one of the analogue signals on a given input channel for output to a 12-bit analogue to digital converter and associated control circuit 80. The selected analogue signal is amplified again by an ADC pre-amplifier 82 before reaching the analogue to digital converter and associated control circuit 80.

The sampling of the analogue to digital converter 80 is controlled by the microprocessor 56 via the control bus 68. At any one sampling instant, magnetic field readings in orthogonal axes from 3 different spaced apart locations are present at the analogue multiplexer 78. In order to bring together sampled data relating to the magnetic field strength in the three orthogonal directions at a single location, it is necessary to provide a small amount of memory (not shown) with the analogue to digital converter 80 which stores the reading of each of the Hall sensors 46 for each location. When all three required readings have been obtained for a particular location which may take several sampling periods, this information can be selectively read out to consecutive memory locations in memory 84. In this way the byte order in which data is generated from the analogue to digital converter 80 is swapped before being stored in the memory 84. In addition, for each sampled location, the coordinates of that location together with the field strength in each of three orthogonal directions is stored.

The array of Hall Effect sensors 46 measure magnetic field strengths from ±0.1 mT to ±200.0 mT in 0.1 mT steps. The resolution of this magnetic field strength measurement is determined by the resolution of the analogue to digital converter 80; the Hall sensors 46 themselves producing analogue outputs. In this case, a 12 bit analogue to digital converter is employed generating 4096 output levels of which 4000 are used to cover the range −200.0 mT to +200 mT in 0.1 mT steps.

The output of the analogue to digital converter 80 can be put on the data bus 72 and sent to the interface board memory 84. The memory 84 comprises a fast 32K static random access memory chip which is sufficient in size to store digital data pertaining to at least one scan line of the scanner robot arm assembly 12. Once a complete line of data has been stored, the microprocessor 56 activates the PC bus communication module 64 to generate a direct memory access request to the PC 18 so that the data stored in the interface board memory 84 can be directly transferred quickly to the main memory (not shown) of the PC 18. Using a direct memory access request rather than a conventional memory transfer via the microprocessor of the PC 18 saves a considerable amount of time which allows the acquisition of further data from the next scan line to be carried out without undue delay.

The interface board 16 also has a set of opto-isolated digital inputs 86 and a set of opto-isolated digital outputs 88 connected to the address, data and control buses 70, 72, 68. These inputs 86 and outputs 88 are provided for monitoring the status of the scanner robot assembly 12, namely the status of each stepper motor, and to check for interlock. Interlock checking is carried out with the use of a DC wire loop through several components of the assembly 12 and through each of the connectors coupling the constituent parts of the system 10 together. If any component or part of the system 10 is unplugged or not correctly electrically coupled, then by virtue of the interlock checking this condition can be determined and the operations of the system 10 can be stopped. The appropriate warning signals can be displayed in software or by simple light emitting diodes controlled by LED driver module 90.

Figure 5:
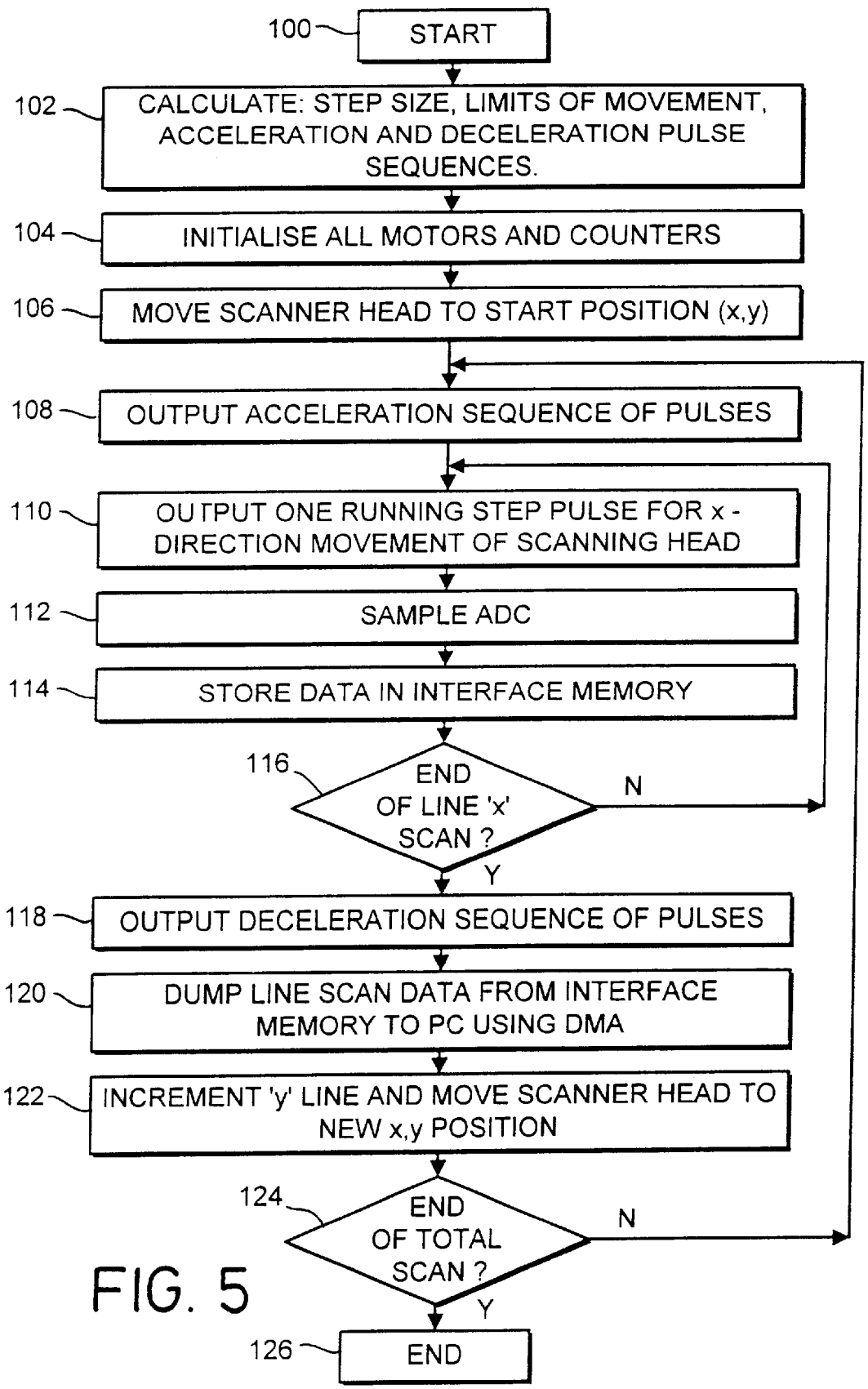
FIG. 5 is a flow diagram showing the steps involved in the acquisition of data from the scanning robot assembly of FIG. 1.

Referring now to FIG. 5, the method used to carry out a magnetic field scan is described. The method commences at 100 with the user initiating a scan from the high-level software running on the PC 18. The user selected parameters of scan resolutions, scan area size and scan area position are downloaded from the PC high level software to the interface board 16. From these downloaded parameters, the running step size and the limits of movement of the scanner head 38 are calculated at 102. Also calculated at 102 are the pulse sequences required to accelerate and decelerate the scanner head 38. Acceleration and deceleration pulses enable the stepper motors to respond quickly to the fast running step pulses for scanning a line across the sample. Without the acceleration and deceleration pulses, the stepper motors could only be run at a lower speed which would disadvantageously slow down the entire scanning process.

The stepper motors and the counters of the microprocessor 56 are initialized at 104 and the outputs of the Hall Effect sensors 46 are effectively zeroed by use of compensating offsets. Signals are output from the interface board 16 at 106 to move the scanner head 38 to a required (user selected) start position for scanning. Scanning commences at 108 with the output of the sequence of acceleration pulses to the lateral drive unit 34, which is moved in the x-direction. Once the lateral drive unit 34 has been accelerated, a single running step pulse is output at 110 for moving the scanning head 38 on e step in the x direction. Then the analog to digital converter 80 is sampled at 112 for each of the Hall sensors 46. The resultant bytes of digital data are recorded and stored at 114 in the interface memory 84.

A check is then carried out at 116 to determine whether or not the end of a scan line has been reached. If the end of the line has not yet been reached further movement, sampling and storage steps 110 to 114 are carried out repeatedly. When the end of the scan line has been reached, the sequence of deceleration pulses is output at 118. The reordered scan line data stored in memory 84 is then transferred at 120 to the memory of the PC 18 using a direct memory access. The scanner head 38 is moved to the next scan line by incrementing the y-coordinate value and moving the longitudinal drive unit 36 to the new x, y coordinates at 122. A check for the coverage of the total scanning area is then carried out at 124 and the scanning method ends at 126 if the total area has been covered. Otherwise, the procedure for scanning another line across the sample (not shown) is repeated, namely steps 108 to 124.

The software which runs in the main memory of the PC 18 will now be described. The function of this high-level software is two-fold; firstly, it provides a user interface for user selection of desired scanning parameters and secondly, it presents the scan data in various display formats which can then be manipulated by the user.

There are three parameters which have to be set for each complete scan of a magnetic sample. One parameter is the scan area size which in this embodiment can be set to various values between 4 mm$^2$ and 200 mm$^2$. Another parameter is the position of scan area within the maximum area of 200 mm$^2$. The position of the scan area is determined by the user moving the origin of the scan area to a desired location. The last parameter which needs to be set is the scan resolution, i.e. the spacing between magnetic field sampling points. As mentioned previously, the spacing between the Hall sensors 46 needs to be an integer multiple of the scan resolution and as this spacing is fixed, the scan resolution parameter is only available as one of a selected set of values which for this embodiment have previously been listed as step sizes from 0.1 mm to 10.00 mm.

Once these three parameters have been selected, the user activates scanning by selecting a run option. The scanning procedure, set out in FIG. 5, is then carried out to completion. At the end of the scanning procedure, the memory of the PC 18 stores the magnetic field data relating to the selected scanning area. The user is then presented with a two-dimensional false colour field map of the sensed field as shown in FIG. 6.

Figure 6:
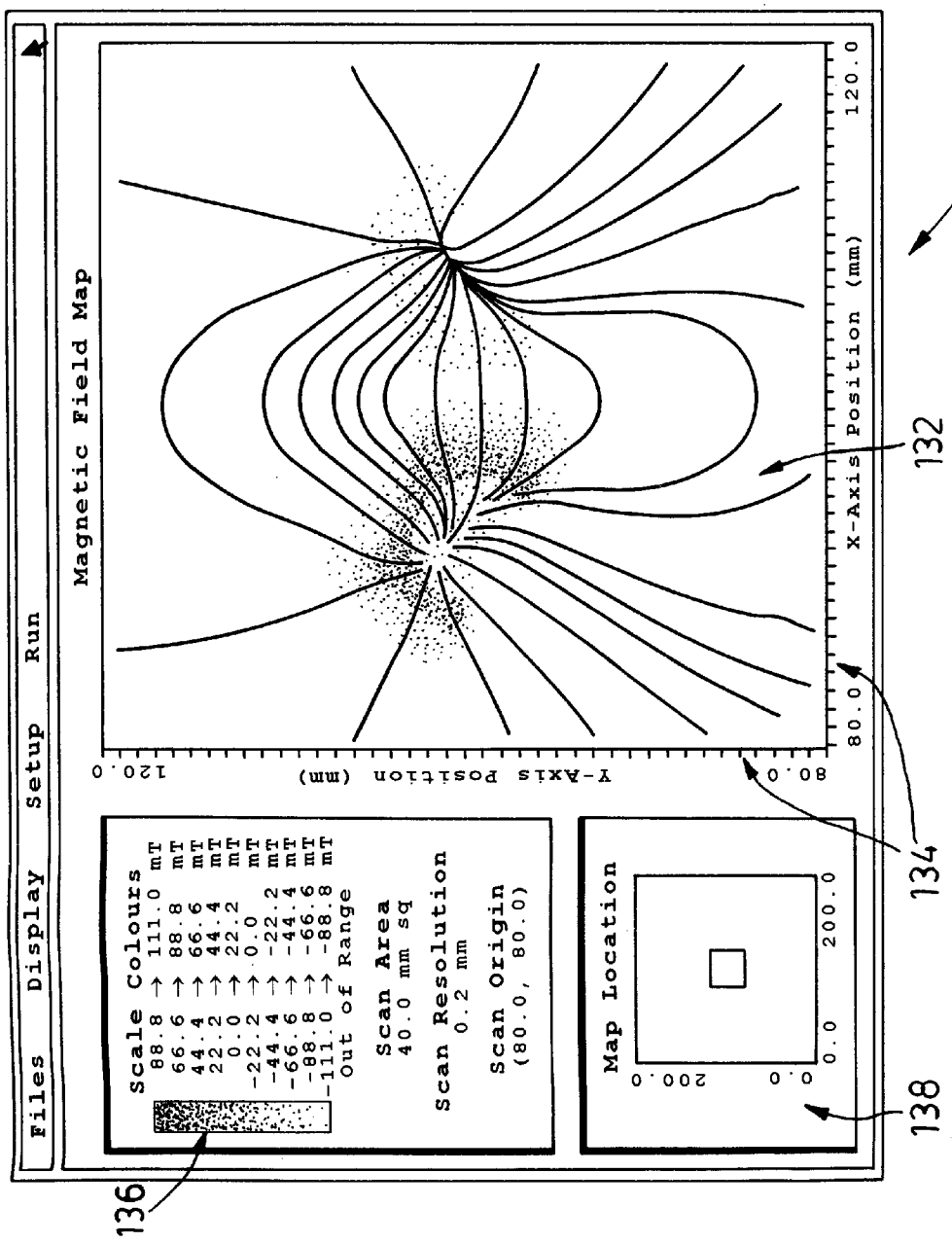
FIG. 6 is a diagram showing a typical software screen as displayed to the user on the monitor of the system of FIG. 1.

Referring now in detail to FIG. 6, the software menu-driven screen 130 which is displayed on the monitor 24 is shown. The screen 130 has a large magnetic field map area 132 which displays the magnetic field data with different colours being used to show different strengths of magnetic field. The example shown is of the magnetic field close to the surface of a small NdFeB magnet used in computer disk drives. The map area 132 is bounded by x and y axis scales 134 in millimetres.

A key 136 to the colours used in the magnetic field map is given to one side of the map area 132 together with a display of the user selected values of the parameters of scan area, scan resolution and scan origin. Furthermore, a map location display 138 is also provided for showing the user where within the 200 mm$^2$ maximum area the present magnetic field map is positioned.

Once the basic two-dimensional field map has been displayed (as seen in FIG. 6 but excluding the vector lines shown thereon), there are various different options available to the user to analyse the data. These options are provided under the DISPLAY menu option and are listed below:

ZOOM

The ZOOM facility allows the user to examine magnetic field maps in closer detail. The user must first select the zoom magnification (x2, x5 or x10) from a submenu. A yellow box is then superimposed on the display indicating the zoom area. This box can be moved around the field map using the mouse or the keyboard arrow keys—the position of the bottom left hand corner is continuously updated in yellow under the title "Zoom Origin". A smaller yellow box moves sympathetically in the small window which shows the zoom position. When the desired zoom area is located, the left mouse button can be clicked or the carriage return key can be pressed—in a few seconds the display is redrawn and the axes relabelled appropriately. A "wait" message is displayed while redrawing the magnified area. Any key can be pressed thereafter to restore the original display.

SCALE

The SCALE facility allows the user to selectively rescale magnetic field maps to highlight areas of interest (e.g. all values above 50.0 mT, or between 1.0 and 3.0 mT). A window is displayed showing the current values of the top and bottom of the scale. By clicking the mouse inside the "Maximum" or "Minimum" boxes the top or bottom of the scale can be changed. Values must be entered in mT—entering illegal value or values out of range forces re-entry. The mouse can be clicked on "OK" to redraw the map to the new scale or clicked on "Cancel" to abort. A "wait" message is displayed while the map is being redrawn. Any values that are out of the range of the new scale are shown in black.

RESTORE

The RESTORE facility allows the user to redraw a magnetic field map to fit the largest and smallest (most positive and most negative) values of sampled data in the same way as when first drawn. The RESTORE facility is useful to restore a field map to its original state after it has been modified by rescaling or superimposing vector lines, for example. A "wait" message is displayed while the map is being redrawn.

COLOURS

The COLOURS facility allows the user to alter the colours that are used to draw the magnetic field map display. A window is displayed showing the ten colours. Buttons are used to increase or decrease the red, green and blue content of each colour as desired. A total of 262,144 colours shades are possible. To modify the colour, the mouse is clicked on its colour box—it is outlined in white to indicate its selection. The mouse is pressed on the +/−buttons to add or subtract red, green or blue. When the limit of any colour component is reached, the buttons can no longer be activated (e.g. for full red, or nil blue). The mouse is clicked on "OK" to accept the new colour scheme or clicked on "Cancel" to abort and revert to the old colours.

CROSS-SECTION

The CROSS-SECTION facility allows the user to view a horizonal (y axis) or vertical (x axis) cross-section of the magnetic field map as a simple line graph. The section of interest is selected using a scrolling yellow line superimposed on the field map which can be moved along the appropriate axis with the mouse or the keyboard arrow keys. The position of the section is continuously updated in yellow under the title "Cross-Section". When the desired section is located the left mouse button is clicked and a window will be displayed showing the graph. The graph is automatically scaled and labelled. The mouse can be clicked on "OK" to restore the original display.

POINT

The POINT facility allows the user to determine the magnitude of the magnetic field at any point on the map. The mouse arrow cursor is replaced by cross-hairs in the field map window. The position of the point at the cross-hairs is constantly updated in yellow under the title "Point Position", and the value of field strength is similarly displayed under the title "Field Strength". The arrow keys on the keyboard can be used for fine positioning of the cross-hairs.

VECTORS

The VECTORS facility allows the user to superimpose field direction information on the magnetic field map. Field direction can be displayed in three modes, shown below:

POINT mode—short white lines are drawn at any point on the field map in the direction of the field. The mouse is clicked at the desired position, shown by cross-hairs superimposed on the map.

GRID mode—a grid of short white lines is automatically drawn on the field map in the direction of the field.

LINE mode—continuous white lines are drawn from any point on the field map, approximating to lines of magnetic force. The mouse is clicked at the desired start position, shown by cross-hairs superimposed on the map. Note FIG. 6 shows line mode analysis of data.

VECTOR AT A POINT

The VECTOR POINT facility allows the user to determine field direction at any individual point on the field map. The mouse is replaced by cross-hairs in the field map window. The left mouse button is clicked or the carriage return key is pressed to draw a short white line from the current position in the direction of the field. A small yellow cross marks the start of the line, which is left on the screen. Using this technique field direction lines can be placed anywhere on the field map as desired. The length of the direction line can be varied using the SETUP VECTOR POINT facility. Field direction lines are only drawn if the magnitude of the vector components is greater than the VECTOR FILTER value.

GRID OF VECTORS

The VECTOR GRID facility draws a grid of field direction lines across the whole magnetic field map. Short while lines are drawn evenly spaced over the map with the origin of the lines indicated by small yellow crosses (exactly as for the VECTOR POINT facility). The density of the grid can be set using the SETUP VECTOR GRID facility. Field direction lines are only drawn if the magnitude of the vector components is greater than the VECTOR FELTER value.

VECTOR LINES

The VECTOR LINE facility allows the user to superimpose APPROXIMATIONS to magnetic lines of force in the field map. The mouse arrow cursor is replaced by cross-hairs in the field map window. The left mouse button is clicked or the carriage return key is pressed to draw a continuous white line following the magnetic line of force. The line is drawn iteratively in increments set using the SETUP VECTOR LINE facility—a short line is drawn in the current direction, then another short line is drawn in the direction of the point at the end of the last line and so on. Line drawing is stopped by one of the following conditions:

OFF LIMITS—The force line goes outside the map boundary;

BELOW VECTOR FILTER—The magnitude of vector components is less than the VECTOR FILTER value (stops drawing at poles);

FIELD DIRECTION REVERSAL—The field direction of the next two iterations is mutually opposite. This constitutes overshoot of a pole; or ITERATION COUNT—Step count reaches 100 iterations.

VECTORS SETUP

The VECTORS SETUP facility allows the user to set parameters used in the three field direction drawing facilities. A sub-menu selects the parameter to be set and button style menus present the available choices. The four parameters are:

POINT LINE LENGTH—The length of the white field direction line drawn by the VECTOR POINT facility can be set to between 10 and 25 screen pixels.

GRID DENSITY—The size of the grid of field direction lines drawn by the VECTOR GRID facility can be set to between 16×16 and 40×40.

LINE LENGTH—The length of the white field direction line drawn at each iteration step by the VECTOR LINE facility can be set to between 8 and 20 screen pixels.

FILTER—The value of the VECTOR FILTER (in mT) can be set to between 0.0 mT and the top of range.

3-D MAP

The 3-D MAP facility allows the user to view magnetic field information as a simple 3-D projection of the sampled data. The contour map is redrawn as a 3-D style projection with coloured contour lines to give an instant appreciation of the field distribution. The 3-D projection is drawn for the full scale field map, and no further processing such as zooming in or drawing vector lines is allowed. The original display can be restored using the DISPLAY RESTORE facility. The 3-D MAP facility is especially useful for obtaining an overall impression of the field of a newly analysed sample with an initial scan run at a coarse resolution.

MAP PLANE

The MAP PLANE facility allows the user to view the magnetic field in the x or y planes. The normal magnetic field display is drawn as a contour map of the component of the field in the direction normal to the surface being scanned (the z plane). By selecting X-PLANE or Y-PLANE from a sub-menu the components of the field in the other two planes can be viewed, drawn as similar contour maps.

The user also has several other facilities available under the FILES menu option and these are listed below:

PRINT—allows printing out to the colour printer 26 of the display screen 130;

SAVE—allows the user to save setup, colour, picture or data files to disk;

LOAD—allows the user to load setup, colour, picture or data files from disk into the memory of the PC;

HELP—provides the user with help on any aspect of the user selectable options and on the general procedure involved in running a scan.

Having described the present invention with reference to a particular embodiment it is to be appreciated that the above described embodiment is exemplary only and is susceptible to modification and variation without departure from the spirit and scope of the invention as determined in the appended claims. For example, it is possible to increase the size of the maximum scan area to provide analysis of large sized magnetic samples without reducing the resolution of the sampling. However, in such a case, the size of the memory 84 in the interface board 16 may need to be increased accordingly to accommodate the additional data produced in each scan line.

A further embodiment of the magnetic field distribution measuring system of the present invention will now be described which is similar in many respects to the above-described system, but which employs a particular type of magnetic field scanner or scanner robot assembly suitable for determining the magnetic field distribution of a cylindrically shaped magnetic sample, for example. The flatbed magnetic field scanner robot assembly hereinbefore described is suitable for determining the magnetic field distributions of relatively flat samples or for sensing the magnetic field produced by any shaped sample within a flat plane above the sample. However, in photocopying technology, for example, it is often necessary to use magnetic rollers which have multiple magnetic poles, for example 24 magnetic poles, each pole running axially along the roller and it is not possible to readily measure the magnetic field distribution of such magnetic rollers with the flatbed magnetic field scanner robot assembly described hereinbefore.

Accordingly, as hereinafter described, a magnetic field scanner robot assembly which is designed to measure specifically the magnetic field distribution of a cylindrical magnetic sample or, more generally, to measure magnetic field strength within a curved or arcuate plane about the sample comprises means for rotating the magnetic sample in combination with a linear scanning means for scanning a magnetic sensor head along the axis of rotation of the sample. In use, the magnet field of a sample is measured by sweeping the magnetic sensor head on the linear scanning means across the sample and then rotating the sample through a predetermined angle about an axis parallel to the scanning direction. The above procedure is then repeated until the required degree of rotation has been achieved. By this arrangement, a magnetic field measurement system employing the above robot assembly is able to measure the magnetic field generated by the sample at an arcuate plane about the curved surface of the sample.

The embodiments as described hereinafter are designed for use with the magnetic field measurement system 10 described hereinbefore as an interchangeable replacement for the flatbed scanner robot assembly 12. Unless otherwise stated, all of the system 10, apart from the robot assembly 12, is identical to that used with the hereinafter described embodiments. Accordingly, to avoid unnecessary repetition, only the differences are described herein.

Referring to FIGS. 7 and 8, the scanner or scanning robot assembly 140 is for use in measuring the magnetic field generated by a cylindrical roller magnet 142. The assembly 140 comprises a linear scanning drive unit 144 incorporating a magnetic sensor head 145, mounted on a scanning arm 146, and a roller mechanism 148 for retaining and rotating the cylindrical roller magnet 142. The assembly 140 is arranged to sequentially rotate the cylindrical roller magnet 142 through a predetermined angle and then scan the magnetic sensor head 145 along the axis of the roller magnet 142.

More specifically, the linear scanning drive unit 144, the magnetic sensor head 145 and the scanning arm 146 are identical to those of the flatbed robot arm assembly 12. As can be seen clearly in FIG. 9, the Hall effect sensors 150 of the magnetic sensor head 145 are mounted via a micrometer 152 and a mounting plate 154 to the drive unit 144. The micrometer 152 allows the magnetic sensor head 145 to be incrementally adjusted to the appropriate position from the roller magnet 142. In this regard, the micrometer 152 is provided with a manual adjustment means 156.

The roller mechanism 148 in this embodiment is arranged to retain a roller magnet 142 which has an axially extending mounting shaft 158 provided at each of its ends. Each mounting shaft 158 has a smaller diameter than that of the main body of the roller magnet 142. The roller mechanism 148 includes a rotary drive motor 160 and an opposing free bearing 162. The drive motor 160 and the free bearing 162 are each rotatably coupled to a respective adjustable chuck/collet 164 which can accurately be driven by the rotary drive motor 160. The ends of the roller magnet 142, i.e. the mounting shafts 158, are each indirectly coupled to the chuck/collets 164 by way of adaptors 166. The advantage of using adaptors 166, is that various different sizes of roller magnets 142 can be accommodated by the scanning robot assembly 140 by simply using appropriately sized adaptors 166, without the need for changing the relative positioning between the rotary drive 160 and the free bearing 162. In this embodiment, the scanning robot assembly 140 is designed to accommodate roller magnets 142 of 20 mm to 400 mm length and 5 mm to 50 mm diameter.

Referring now to FIGS. 10(*a*) and 10(*b*), each adaptor 166 has a mounting shaft receiving end 168 for coupling to the mounting shaft 158 of the roller 142 and a spindle end 170 suitable for being gripped by the chuck/collet 164. The mounting shaft receiving end 168 has a bore 172 which has a diameter only slightly larger than that of the mounting shafts 158 and a cutout section 174 which defines two semi-circular clamping halves 176 of the mounting shaft receiving end 168. Two clamping screw receiving formations 178 are provided about the bore 172 for receiving clamping screws (not shown). The use of clamping screws in this arrangement applies an even pressure around the mounting shafts 158 of the roller magnet 142 in use and advantageously prevents damage to the shafts 158. In addition, it is not necessary for the mounting shafts 158 to have a flat edge or any other special mounting formation provided.

The rotary drive motor 160 and the linear scanning drive unit 144 each include a stepper motor (not shown) which has a resolution of 1000 steps per revolution. The minimum step size on the linear axis is 0.1 mm and on the rotational axis is 0.36 degrees. In the present embodiment, it is desired to have a scan of 40,000 data points, namely 200×200 data points. To scan the entire surface of a roller magnet 142 of 400 mm length, a linear spatial resolution of 400/200=2 mm and an angular spatial resolution of 360/200=1.8 degrees would be possible. This is a high enough resolution to map magnetic fields generated by a typical 24 pole roller magnet 142 which would have a pole pitch of 360/24=15 degrees assuming equal spacing. If sufficient memory was provided in the PC, then the highest resolutions of 0.1 mm and 0.36 degrees could be used for example to produce a scan of 4 million (4000×1000) data points for the 400 mm roller magnet 142.

Using the software described in the previous embodiment, the following ranges for the rotational axis and linear axis are independently selectable by the user:
Rotational (slow, stepping) axis:
  0 to 45 degrees; 0 to 90 degrees; 0 to 180 degrees; and 0 to 360 degrees.
Linear (fast) axis:
  0 to 10 mm; 0 to 20 mm; 0 to 40 mm; 0 to 100 mm; 0 to 200 mm; and 0 to 400 mm.

The linear resolution is 2 mm on the 400 mm range down to 0.1 mm on the 20 mm range and below and the rotational resolution is 1.8 degrees on the 360 degree range down to 0.36 degrees on the 45 degree range. Typically, a full 40,000 data point scan of 400 mm and 360 degrees can be completed in under 7 minutes.

Figure 11B:
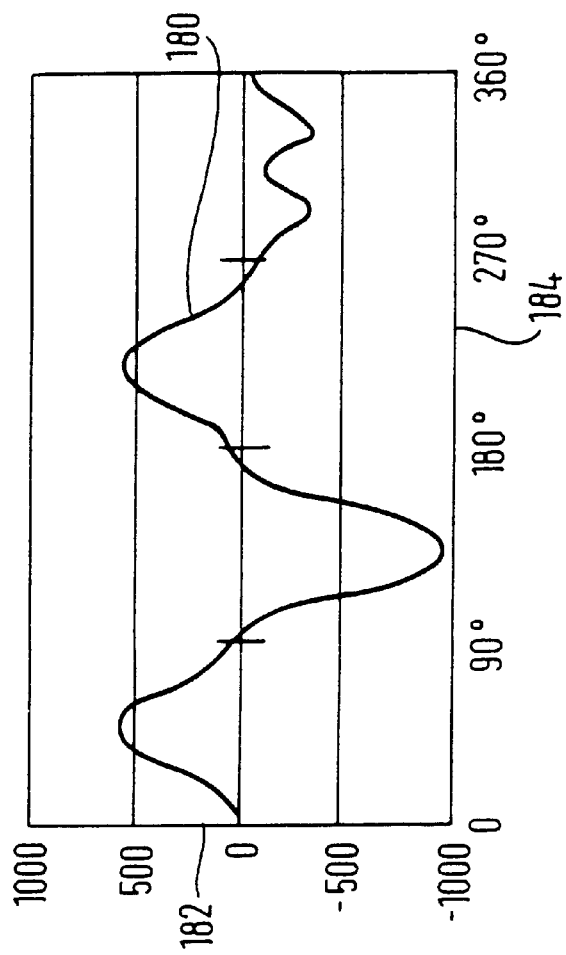
FIG. 11(b) is a cartesian plot of the information shown in FIG. 11(a)
Figure 11A:
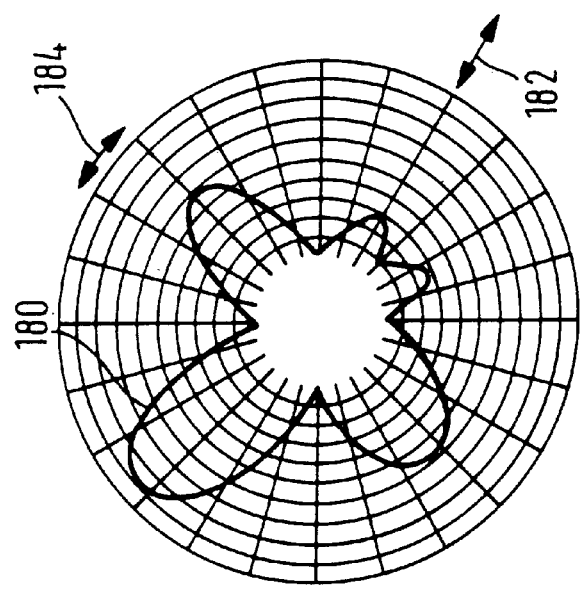
FIG. 11(a) is a polar plot of magnetic field strength verses angle of rotation for a cylindrical magnetic sample.

The computer program which drives the system 10 is identical to that described in the previous application apart from the following differences. Referring to FIGS. 11(*a*) and 11(*b*), the map of magnetic field distribution 180 is displayed in millimeters for the linear scanning axis 182 and in degrees for the slow-scanning rotational axis 184. The software is designed to present the information as a graphical plot using Cartesian coordinates as in FIG. 11(*b*) or as a graphical plot using Polar coordinates as in FIG. 11(*a*).

The scanner robot assembly 140 is not limited to scanning cylindrical magnetic samples. It is possible to measure the magnetic fields generated from the outer surface of magnetic samples having an arcuate segment shape. In this case, it is necessary to provide a suitable mounting carrier (not shown) which can retain the arcuate magnetic sample segments and which is rotatable by the scanner robot assembly 140. In this particular embodiment, the maximum radius of curvature of the outer surface of the arcuate segments is constrained to be 25 mm or below. However, in other embodiments this could readily be larger.

Referring now to FIG. 12, there is shown another different scanner robot assembly 190 which can replace the previously described scanner robot assembly 140 in the system 10. The scanner robot assembly 190 is arranged to measure the magnetic field generated within a hollow cylindrical roller magnet or a ring magnet 192. The scanner robot assembly 190 is very similar to the previously described robot assembly 140 and therefore only the differences will be described hereinafter.

The scanner robot assembly 190 comprises the same linear scanning drive unit 144 mounted on the scanning arm 146 as in the previous scanner robot assembly 140. However, the magnetic sensor head 194 is different to the magnetic sensor head 145, in that the magnetic Hall sensors 196 are mounted on a laterally extending finger 198 of the sensor head 194. The linear movement of the linear scanning drive unit 144 therefore moves the finger 198 into and out of the inner region of the ring magnet 192 so as to effect scanning of the inner region of the ring magnet 192.

The ring magnet 192 is held on its outer diameter by a clamp 200 with a spindle 202. A rotary drive unit 160, a chuck/collet 164 and an adaptor 166 are provided as in the previous scanning robot assembly 140 to provide accurate and stable rotation of the ring magnet 192. It is not necessary to provide a free bearing 162 and its associated chuck/collet 164 and adaptor 166 for supporting the opposite side of the ring magnet 192.

It is possible to ensure that the correct scanner robot assembly 12, 140, 190 is being used with the system 10 in its current software mode. This is achieved by having different software identifiable interlock circuits for each scanner robot assembly 12, 140, 190 and appropriate viewing screens provided on the PC to indicate when the correct scanner robot assembly 12, 140, 190 is not being used. Alternatively, a simpler solution is to have similar but separate software programs for each type of assembly 12, 140, 190, with an initial warning screen indicating that it is the operator's responsibility to ensure that the correct assembly 12, 140, 190 is connected.

A further adaptation of the flat plane scanner robot assembly 12 of the first-described embodiment is illustrated in FIGS. 13(*a*) and 13(*b*). In FIG. 13(*a*) the magnetic sensor head 210 is movable in x and y directions 212, 214 within a scanned flat plane 216 above the magnetic sample 218 as described previously in relation to the scanner robot assembly 12. In the adaptation shown in FIG. 13(*b*), the magnetic sensor head 220 has its Hall sensors 222 mounted on an elongate laterally extending finger 224 similar to that described in relation to FIG. 12. The head 220 is insertable within a ring magnet or a hollow magnetic cylinder 226 and is movable in x and y directions 212, 214 such that a flat plane 228 can be scanned within the cylinder 226.

Another adaptation of the flat plane scanner robot assembly 12 of the first-described embodiment is to provide a three-dimensional scanner robot assembly (not shown). The idea of having a 3-dimensional scanner is of greatest utility with irregular shaped magnetic samples, where sensing the magnetic field in a single plane whether flat or curved does not provide optimum information about magnetic field distribution of the sample. Rather, with the 3-dimensional scanner non-uniform surface areas of the sample can be sensed by a sensing head which is capable of being moved in a corresponding non-uniform manner.

The sensing head of the 3-dimensional scanner can have an active positional adjustment device which is used to keep the sensing head at a constant distance from the surface of the sample as it is being scanned. This is simply achieved by having an optical proximity sensor which provides a signal that is used in a control feedback loop to adjust the position of the sensing head. Alternative ways of determining the sensing head distance from the sample surface would be to use acoustic or radar sensors. In this way, it would be possible to scan the surface of regular and irregular samples without any predetermined knowledge of the shape of the sample.

The 3-dimensional scanner robot assembly employs a 3-coordinate system for defining any point in the operating volume of robot assembly. The robot assembly incorporates linear movement motors in three orthogonal axes to position and move the sensing head appropriately. Alternatively, it is possible to use an angularly movable robot arm with an extendible length and angular joints or even a hexapod positioning structure such as described in International patent application no. WO-A-92/17313 for example, to provide the structure for moving the sensing head about the sample.

It is to be appreciated that the above described systems are not limited to measuring magnetic field distribution of magnetic samples. It is possible to replace the magnetic sensors in the sensing head by sensors to measure other appropriate material properties such as reflectivity, surface roughness or corrosion current for example. The information derived from such non-magnetic sensing head could readily be analysed and displayed on the PC display of the system 10.

What is claimed is:

1. An apparatus for determining the magnetic field distribution of a magnetic sample, the apparatus comprising:

magnetic field sensing means for sensing the magnetic field produced by the sample at a given location, said magnetic field sensing means comprising a sensing head having a plurality of magnetic sensors arranged to sense magnetic field strength in plural orthogonal directions;

scanning means arranged to effect area scanning of said magnetic sample by movement of said sensing head relative to the sample along a predetermined scan pattern, said scanning means making sub-millimeter positional movements of said sensing head and thus achieving a correspondingly high resolution of the magnetic field distribution determined by the apparatus;

data acquisition means coupled to said magnetic field sensing means and to said scanning means, said data acquisition means-being dedicated to the processing of signals outputted by said sensors and to the control of said scanning means and comprising analog-to-digital signal conversion means coupled to said sensors for converting the analog outputs thereof into corresponding digital signals;

storage means for storing said digital signals;

a microprocessor controlling the operation of said analog-to-digital signal conversion means and the storage of said digital signals in said storage means, said microprocessor additionally controlling the operation of said scanning means in coordination with said analog-to-digital signal conversion means and said storage means; and computer means including display means, said computer means being arranged to receive digital data from the storage means of said data acquisition means under control of said microprocessor, to process said digital data into user understandable magnetic field maps, and to display said magnetic field maps upon said display means, wherein the scanning means comprises a robot assembly to which said sensing means is coupled, said robot assembly including first means for moving said sensing means in one coordinate dimension, and second means for effecting relative rotation between the sample and the sensing means.

2. An apparatus according to claim 1, wherein the data acquisition means is arranged to carry out data acquisition and to store the digital data in said storage means in real time.

3. An apparatus according to claim 1, wherein said storage means provides a temporary storage and said data acquisition means is arranged to carry out a direct memory access to a main storage means to which the data acquisition means is connected.

4. An apparatus according to claim 1, further comprising a program storage means for storing a program for controlling the microprocessor to carry out data acquisition.

5. An apparatus according to claim 1, wherein the data acquisition means includes means for checking the status of the scanning means and the sensing means to ensure that the apparatus is only operated under predetermined status conditions.

6. An apparatus according to claim 1, wherein said magnetic field sensing means and said data acquisition means are arranged to sense the magnetic field of the magnetic sample in three orthogonal directions and to obtain a three-dimensional representation of the magnetic field.

7. An apparatus according to claim 1, wherein said computer means is arranged to provide a false color image display format.

8. An apparatus according to claim 1, wherein said computer means includes means for analyzing the data from the data acquisition means to determine magnetic force vectors and/or lines of force and for superimposing such vectors and/or lines of force on the displayed magnetic field map.

9. An apparatus according to claim 1, wherein said computer means includes means for analyzing the data from the data acquisition means to provide a magnetic field strength cross-section through a user selectable position on the magnetic field map.

10. An apparatus according to claim 1 wherein the scanning means comprises a robot assembly to which said sensing means is coupled, said robot assembly including first means for moving said sensing means in one coordinate dimension, and second means for moving the sensing means in another coordinate dimension transverse to said one coordinate dimension.

11. An apparatus according to claim 1 wherein said sensing means comprises a head with a plurality of sensors spaced-apart along a scan line, each sensor sensing magnetic field strength in a different direction than the other sensors, the sensing means being arranged to be moved along said scan line during a scanning operation such that each sensor can sense the magnetic field in its direction at any given location.

12. An apparatus according to claim 11, wherein each of said plurality of sensors is a Hall Effect sensor.

13. The apparatus of claim 1, wherein said scanning means comprises a scanner robot assembly.

14. The apparatus of claim 1, wherein said scanning means comprises an X-Y flatbed device.

15. The apparatus of claim 1, wherein said scanning means effects area scanning of the magnetic sample by stepwise movement of the sensing head by a step size of 0.1 mm.

16. The apparatus of claim 1, wherein said scanning means effects area scanning of the magnetic sample by stepwise movement of the sensing head by a step size in the range of 0.1 to 10.0 mm.

17. The apparatus of claim 1, wherein said scanning means effects area scanning of the magnetic sample by stepwise movement of the sensing head by a step size selected from the group consisting of 0.1 mm, 0.2 mm, 1.0 mm, 5.0 mm, and 10.0 mm.

18. A magnetic field scanner for measuring the magnetic field distribution of a magnetic sample in a curved plane about the sample, the scanner comprising:

magnetic field sensing means for sensing the magnetic field produced by the magnetic sample in a plurality of directions at a given location along the curved plane; and scanning means comprising rotation means and linear movement means, said rotation and linear movement means being operable on at least one of said sample or sensing means to provide both linear and rotational relative movement between the sample and the magnetic field sensing means in use, wherein the magnetic field sensing means comprises an elongate probe for insertion into an inner region of a hollow cylindrically shaped magnetic sample, the probe having at least one sensor provided at a free insertion end thereof.

19. A magnetic field scanner according to claim 18, wherein the rotation means is operable on the sample and the linear movement means is operable on the sensing means.

20. A magnetic field scanner according to claim 19, wherein the rotation means comprises a means for retaining the magnetic sample and means for rotating the retaining means and the magnetic sample together.

21. A magnetic field scanner according to claim 20, wherein the rotation means comprises a stepper motor with a rotary output and a free bearing, the retaining means and magnetic sample being provided between the rotation means and the free bearing.

22. A magnetic field scanner according to claim 20, wherein the retaining means comprises at least one chuck mechanism and at least one adaptor, said at least one adaptor being securable in a respective one of said at least one chuck mechanisms and being arranged to be releasably secured to an end of said magnetic sample.

23. A magnetic field scanner according to claim 18 wherein the magnetic field sensing means comprises a plurality of spaced apart Hall Effect sensors.

24. A magnetic field measuring apparatus incorporating a magnetic field scanner according to claim 18 wherein the apparatus is arranged to display data obtained from the scanner in a polar coordinate magnetic field map.

* * * * *